United States Patent
Yu

(10) Patent No.: US 8,409,975 B1
(45) Date of Patent: Apr. 2, 2013

(54) METHOD FOR DECREASING POLYSILICON GATE RESISTANCE IN A CARBON CO-IMPLANTATION PROCESS

(75) Inventor: Liujiang Yu, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/339,417

(22) Filed: Dec. 29, 2011

(30) Foreign Application Priority Data

Sep. 8, 2011 (CN) .......................... 2011 1 0265267

(51) Int. Cl.
*H01L 21/425* (2006.01)
(52) U.S. Cl. ......... 438/514; 257/E21.433; 257/E21.633; 257/E21.634; 438/199; 438/230; 438/232; 438/301; 438/369; 438/373; 438/407; 438/440; 438/506; 438/519; 438/527
(58) Field of Classification Search ........... 257/E21.433, 257/E21.633, E21.634; 438/199, 230, 232, 438/301, 369, 373, 407, 440, 506, 514, 519, 438/527
See application file for complete search history.

(56) References Cited

U.S. PATENT DOCUMENTS

| | | | | |
|---|---|---|---|---|
| 5,998,272 | A * | 12/1999 | Ishida et al. ................... | 438/305 |
| 6,743,686 | B2 * | 6/2004 | Lee et al. ...................... | 438/303 |
| 7,074,684 | B2 * | 7/2006 | Roy et al. ...................... | 438/300 |
| 2010/0003799 | A1 * | 1/2010 | Lee ............................... | 438/305 |

* cited by examiner

*Primary Examiner* — Asok K Sarkar
(74) *Attorney, Agent, or Firm* — Renner, Otto, Boisselle & Sklar, LLP

(57) ABSTRACT

A method for decreasing polysilicon gate resistance in a carbon co-implantation process which includes: depositing a first salicide block layer on a formed gate of a MOS device and etching it to form a first spacer of a side surface of the gate of the MOS device; performing a P-type heavily doped boron implantation process and a thermal annealing treatment, so as to decrease the resistance of the polysilicon gate; removing said first spacer, performing a lightly doped drain process, and performing a carbon co-implantation process at the same time, so as to form ultra-shallow junctions at the interfaces between a substrate and source region and drain region below the gate; re-depositing a second salicide block layer on the gate and etching the mask to form a second spacer; forming a self-aligned silicide on the surface of the MOS device. The invention can decrease the resistance of the P-type polysilicon gate.

4 Claims, 4 Drawing Sheets

```
┌─────────────────────────────────────────────────────────────────────┐
│ depositing a first salicide block layer on a formed gate of a MOS   │
│ device, then etching said first salicide block layer to form a      │
│ first spacer of the side surface of the gate of the MOS device      │
└─────────────────────────────────────────────────────────────────────┘
                                  │
                                  ▼
┌─────────────────────────────────────────────────────────────────────┐
│ performing a P-type heavily doped boron implantation process and    │
│ a thermal annealing treatment                                       │
└─────────────────────────────────────────────────────────────────────┘
                                  │
                                  ▼
┌─────────────────────────────────────────────────────────────────────┐
│ removing said first spacer, performing a lightly doped drain        │
│ process, and performing a carbon co-implantation process at the     │
│ same time                                                           │
└─────────────────────────────────────────────────────────────────────┘
                                  │
                                  ▼
┌─────────────────────────────────────────────────────────────────────┐
│ re-depositing a second salicide block layer on the gate, then       │
│ etching the mask to form a second spacer                            │
└─────────────────────────────────────────────────────────────────────┘
                                  │
                                  ▼
┌─────────────────────────────────────────────────────────────────────┐
│ performing a self-alignment silicide process, to form a             │
│ self-aligned silicide on the surface of the MOS device              │
└─────────────────────────────────────────────────────────────────────┘
```

Fig. 1

METHOD FOR DECREASING POLYSILICON GATE RESISTANCE IN A CARBON CO-IMPLANTATION PROCESS

CROSS REFERENCE TO RELATED APPLICATIONS

The present invention claims priority under 35 U.S.C. §119 to Chinese Patent Application No. 201110265267.X, "METHOD FOR DECREASING POLYSILICON GATE RESISTANCE IN A CARBON CO-IMPLANTATION PROCESS", filed on Sep. 8, 2011, the entire content of which is incorporated herein by reference.

FIELD OF THE INVENTION

The present invention relates to semiconductor manufacturing, and particularly to a method for decreasing polysilicon gate resistance in a carbon co-implantation process.

BACKGROUND OF THE INVENTION

Chips are processed in batches during the process for manufacturing semiconductor devices, in which a large number of complicated devices are formed on one piece of wafer. The size of chips becomes smaller and smaller while their integrating density grows higher and higher with speedy development of GSI (Grand Scale Integration).

SCE (Short Channel Effects) occurs when the MOS (Metal Oxide Semiconductor Transistor) channel is shortened to a certain degree. When the length of the channel is decreased to a certain degree, the depletion regions of source junction and drain junction have increased proportions in the whole channel, and the quantity of charge required for the formation of an inversion layer on silicon surface below the gate decreases, thus the threshold voltage (Vt) decreases, and the cutoff current (Ioff) increases at the same time. Owing to SCE, the threshold voltage becomes very susceptible to length change of the channel, which makes the control on the process for manufacturing semiconductor devices become more difficult.

An Ultra-Shallow Junction process is generally employed in 65 nm-below scale semiconductor process to suppress SCE of a CMOS (Complementary MOS) device. Moreover, low energy boron ion implantation process is used in Lightly Doped Drain (LDD) process for a PMOS (P-channel MOS) device. Therefore, in order to reduce the diffusion of boron atoms in silicon substrate and obtain ultra-shallow junctions, a carbon co-implantation process may be employed during the LDD implantation process. The carbon co-implantation process contributes to the formation of ultra-shallow junctions for the reason that carbon atoms help to reduce the diffusion of boron atoms in the silicon substrate.

However, since the polysilicon gate is carbon co-implanted during the LDD implantation process, and in the following performed P-type heavily doped boron implantation (P Plus Implantation) process and the thermal annealing process, carbon atoms implanted in the LDD implantation process reduce the diffusion of P-type heavily doped implanted boron atoms in the polysilicon gate as well, the boron atoms in the polysilicon gate can not diffuse sufficiently and the resistance of the P-type polysilicon gate increases.

SUMMARY OF THE INVENTION

Aiming at the above problems, it's an object of the invention to provide a method for decreasing polysilicon gate resistance in a carbon co-implantation process to prevent the diffusion of P-type heavily doped implanted boron atoms from being suppressed by implanted carbon through adjusting the carbon co-implantation process, so that the heavily doped implanted boron atoms can diffuse sufficiently in a polysilicon gate and the resistance of the polysilicon gate can be decreased.

The object of the invention will be realized by means of a technical solution described hereinafter.

A method for decreasing polysilicon gate resistance in a carbon co-implantation process comprises:

depositing a first salicide block layer on a formed gate of a MOS device, then etching said first salicide block layer to form a first spacer of a side surface of the gate of the MOS device;

performing a P-type heavily doped boron implantation process and a thermal annealing treatment, so as to decrease the resistance of the polysilicon gate;

removing said first spacer, performing a lightly doped drain process, and performing a carbon ion co-implantation process at the same time, so as to form ultra-shallow junctions at the interface between a substrate and source region and the interface between the substrate and drain region below the gate;

re-depositing a second salicide block layer on the gate, then forming a second spacer after etching;

performing a self-alignment salicide process, to form a self-aligned salicide on the surface of the MOS device.

In the method for decreasing polysilicon gate resistance in a carbon co-implantation process described above, said first salicide block layer on the formed gate of the MOS device is SiN.

In the method for decreasing polysilicon gate resistance in a carbon co-implantation process described above, a low energy boron ion implantation process is employed as said lightly doped drain process.

In the method for decreasing polysilicon gate resistance in a carbon co-implantation process described above, dry etching is employed in the formation of both the first spacer and the second spacer through etching the salicide block layers.

The advantageous effects of this invention over the prior art are given as following. The invention can prevent the problem that P-type heavily doped boron atoms cannot diffuse sufficiently in a P-type polysilicon gate due to the carbon implantation process, and thus can decrease the resistance of the P-type polysilicon gate, by adjusting the process sequence of carbon co-implantation process, that is, by performing a P-type heavily doped boron implantation process before lightly doped drain process.

BRIEF DESCRIPTION OF THE DRAWINGS

FIG. 1 is a block diagram schematically illustrating the flow of the method for decreasing polysilicon gate resistance in a carbon co-implantation process according to the present invention;

DETAILED DESCRIPTION OF THE EMBODIMENTS

Hereinafter, specific embodiments of the present invention will be described in details with reference to the accompanying drawings.

As shown in FIG. 1, the method for decreasing polysilicon gate resistance in a carbon co-implantation process according to the present invention comprises the following steps.

Figure 2A:
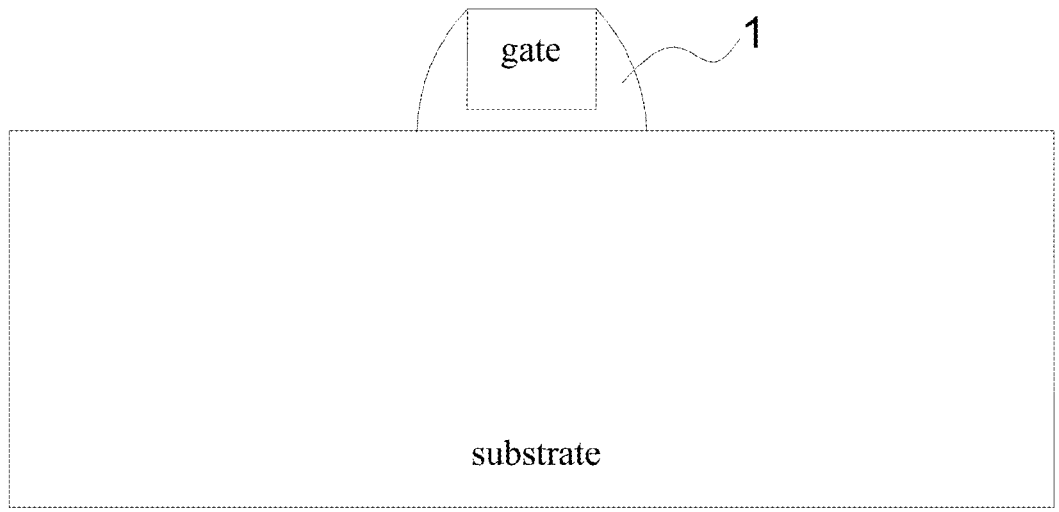
FIG. 2a-FIG. 2e are resultant diagrams schematically illustrating the respective steps of the method for decreasing polysilicon gate resistance in a carbon co-implantation process according to the present invention.

A first salicide block layer is deposited on a formed gate of a MOS device, followed by the first salicide block layer being etched to form a first spacer 1 of a side surface of the gate of the MOS device. The resultant diagram is schematically illustrated in FIG. 2a.

Figure 2B:
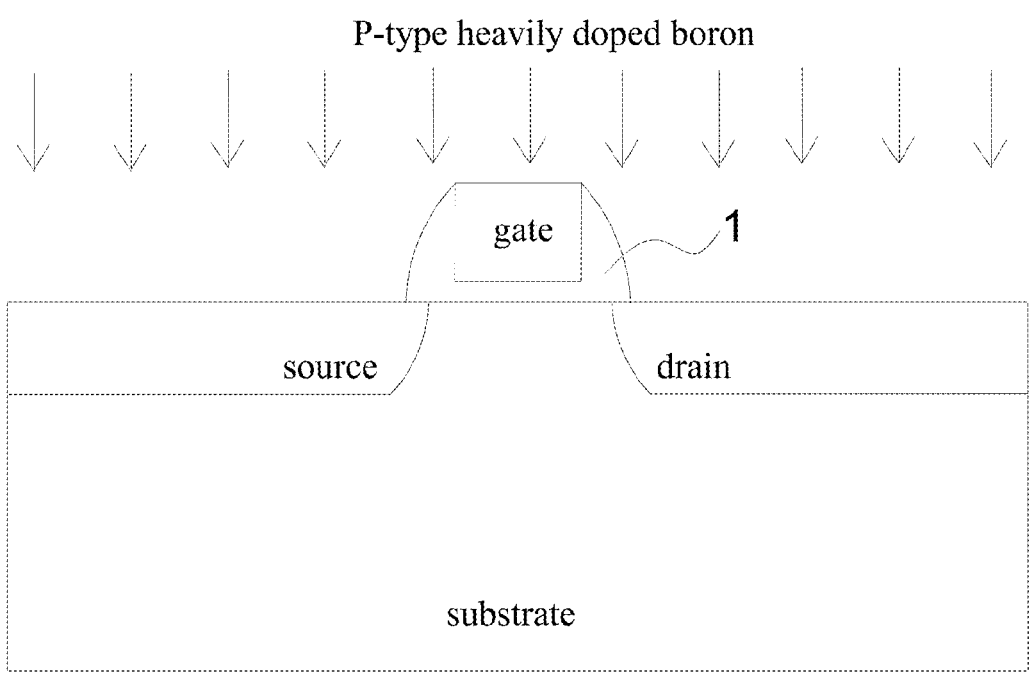

As shown in FIG. 2b, a P-type heavily doped boron implantation process and a thermal annealing treatment are performed so that the boron atoms in the polysilicon gate can diffuse sufficiently owing to the absence of carbon atoms.

Figure 2C:
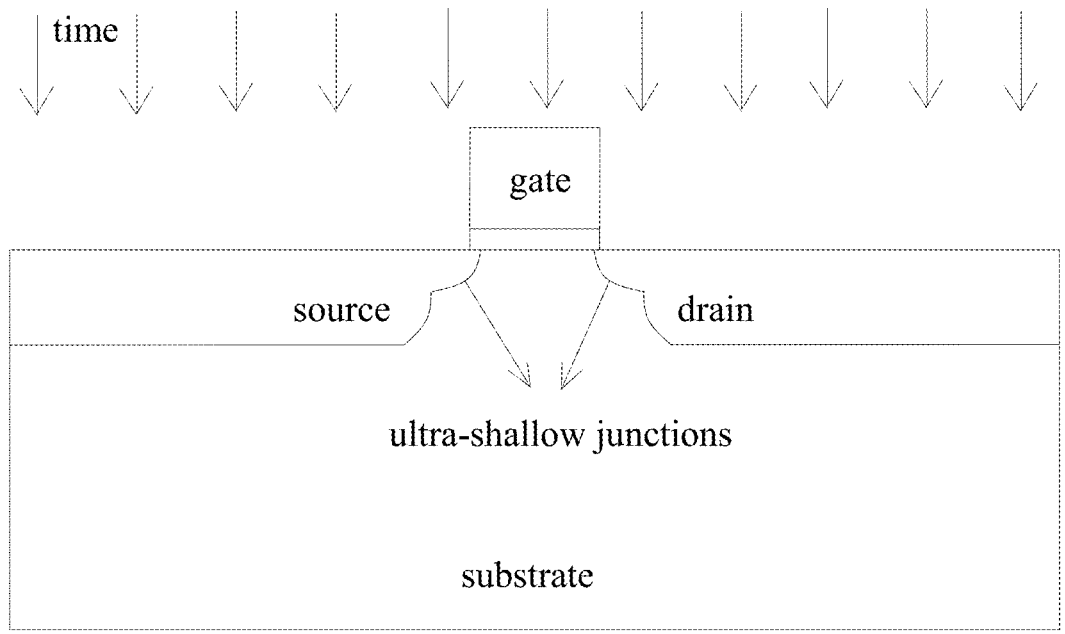

As shown in FIG. 2c, after the first spacer 1 is removed, a lightly doped drain (LDD) process is performed, and a carbon co-implantation process is performed at the same time. The diffusion of boron atoms implanted by the LDD process is suppressed due to the present of carbon atoms, thus ultra-shallow junctions are formed at the substrate below the gate, that is, at the interface between the substrate and source region and the interface between the substrate and drain region. However, since the heavily doped boron atoms in the polysilicon gate have already diffused sufficiently during the foregoing thermal annealing process, they are not affected by the co-implanted carbon, and thus the resistance of the polysilicon is decreased.

Figure 2D:
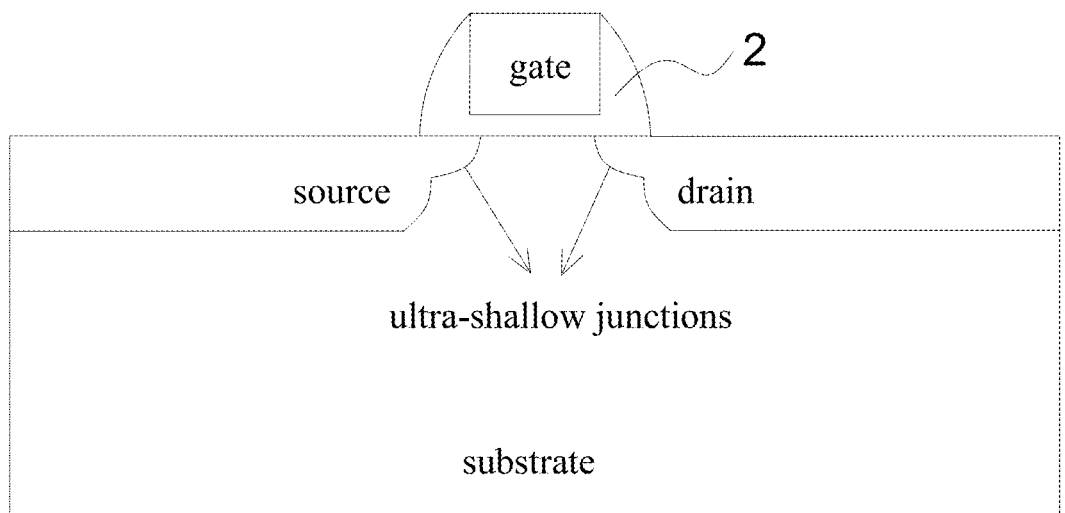

As shown in FIG. 2d, a second salicide block layer is re-deposited on the gate, then the second salicide block layer is etched to form a spacer 2.

Figure 2E:
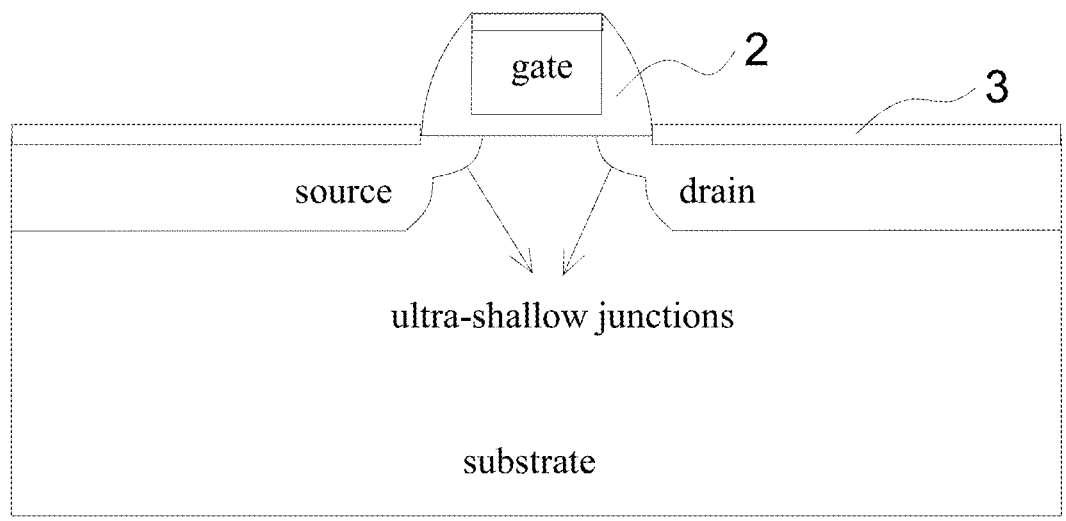

As shown in FIG. 2e, a self-alignment silicide process is performed, then a self-aligned silicide 3 is formed on the surface of the MOS device.

Furthermore, the first salicide block layer deposited on the formed gate of the MOS device is made from SiN.

Furthermore, a low energy boron ion implantation process is employed as the LDD process.

Furthermore, a dry etching is employed in the formation of both the first spacer 1 and the second spacer 2 through etching the salicide block layers.

To sum up the above, the method for decreasing polysilicon gate resistance in a carbon co-implantation process according to the present invention is able to prevent the problem that P-type heavily doped boron atoms cannot diffuse sufficiently in a P-type polysilicon gate due to a carbon implantation process, thus decreasing the resistance of the P-type polysilicon gate. For example, in 55 nm scale process, the improved process makes the resistance of a P-type polysilicon gate be decreased from a relatively higher value of 700 Ω/square to 300 Ω/square.

Although the present invention has been described with reference to some embodiments, it is not limited to the above-described embodiments which are only exemplary. It should be understood by those skilled in the art that any equivalent modifications and substitution made to the method for decreasing polysilicon gate resistance in a carbon co-implantation process may fall within the scope of the present invention. Therefore, all variations and modifications implemented without departing from the spirit and essence of the present invention should be covered by the scope of the present invention.

The invention claimed is:

1. A method for decreasing polysilicon gate resistance in a carbon co-implantation process, comprising:
    depositing a first salicide block layer on a formed gate of a MOS device, then etching said first salicide block layer to form a first spacer on a side surface of the gate of the MOS device;
    performing a P-type heavily doped boron implantation process and a thermal annealing treatment to make heavily doped boron atoms in the polysilicon gate diffused sufficiently during the thermal annealing treatment, so as to decrease resistance of the polysilicon gate;
    removing said first spacer, performing a lightly doped drain process, and performing a carbon ion co-implantation process at the same time, so as to form ultra-shallow junctions at interfaces in the MOS device between a substrate and a source region and between the substrate and a drain region below the gate, after performing the P-type heavily doped boron implantation process and the thermal annealing treatment;
    re-depositing a second salicide block layer on the gate, then etching the second salicide block layer to form a second spacer;
    performing a self-alignment silicide process, to form a self-aligned silicide on surface of the MOS device.

2. The method for decreasing polysilicon gate resistance in a carbon co-implantation process according to claim 1, wherein said salicide block layer deposited on the formed gate of the MOS device is a SiN.

3. The method for decreasing polysilicon gate resistance in a carbon co-implantation process according to claim 1, wherein a low energy boron ion implantation process is employed as said lightly doped drain process.

4. The method for decreasing polysilicon gate resistance in a carbon co-implantation process according to claim 1, wherein a dry etching is employed in the formation of both the first spacer and the second spacer through etching the salicide block layers.

* * * * *